United States Patent
Kim et al.

(10) Patent No.: US 11,784,041 B2
(45) Date of Patent: Oct. 10, 2023

(54) PREPARATION OF LANTHANIDE-CONTAINING PRECURSORS AND DEPOSITION OF LANTHANIDE-CONTAINING FILMS

(71) Applicants: L'Air Liquide, Société Anonyme pour l'Etude et l'Exploitation des Procédés Georges Claude, Paris (FR); American Air Liquide, Inc., Fremont, CA (US)

(72) Inventors: Daehyeon Kim, Hwaseong (KR); Junhyun Song, Seoul (KR); Wontae Noh, Seoul (KR); Venkateswara R. Pallem, Hockessin, DE (US)

(73) Assignees: L'Air Liquide, Sociéte Anonyme pour l'Etude et l'Exploitation des Procédés Georges Claude, Paris (FR); American Air Liquide, Inc., Fremont, CA (US)

( * ) Notice: Subject to any disclaimer, the term of this patent is extended or adjusted under 35 U.S.C. 154(b) by 0 days.

(21) Appl. No.: 17/666,686

(22) Filed: Feb. 8, 2022

(65) Prior Publication Data

US 2023/0253200 A1    Aug. 10, 2023

(51) Int. Cl.
*H01L 21/02* (2006.01)
*C07F 5/00* (2006.01)
*C23C 16/40* (2006.01)

(52) U.S. Cl.
CPC ......... *H01L 21/02192* (2013.01); *C07F 5/00* (2013.01); *C23C 16/409* (2013.01); *H01L 21/0228* (2013.01); *H01L 21/02205* (2013.01)

(58) Field of Classification Search
CPC ......... H01L 21/02192; H01L 21/02205; H01L 21/0228; C07F 5/00
See application file for complete search history.

(56) References Cited

U.S. PATENT DOCUMENTS 8,747,965 B2    6/2014    Mogi et al.

FOREIGN PATENT DOCUMENTS

| KR | 2021 0155106 | 12/2021 |
|---|---|---|
| WO | WO 2009 149372 | 12/2009 |
| WO | WO 2021 050168 | 3/2021 |
| WO | WO 2021 071567 | 4/2021 |
| WO | WO 2022 014344 | 1/2022 |

OTHER PUBLICATIONS

Yang (Organometallics; 8(5), 1989, 1129-1133).*
International Search Report and Written Opinion for corresponding PCT/US2023/012497, dated May 30, 2023.

* cited by examiner

*Primary Examiner* — Pancham Bakshi
(74) *Attorney, Agent, or Firm* — Allen E. White

(57) ABSTRACT

The disclosed lanthanide precursor compounds include a cyclopentadienyl ligand having at least one aliphatic group as a substituent and at least one bidentate ligand. These precursors are suitable for depositing lanthanide containing films.

6 Claims, 1 Drawing Sheet

PREPARATION OF LANTHANIDE-CONTAINING PRECURSORS AND DEPOSITION OF LANTHANIDE-CONTAINING FILMS

TECHNICAL FIELD

The field of the disclosure relates to chemicals for vapor phase deposition of materials for semiconductor manufacturing.

The present invention is at least industrially applicable to deposition of lanthanide materials for semiconductor manufacturing.

BACKGROUND ART

One of the serious challenges the semiconductor industry faces is developing new gate dielectric materials for Dynamic Random Access Memory (DRAM) and capacitors. For decades, silicon dioxide ($SiO_2$) was a reliable dielectric, but as transistors have continued to shrink and the technology moved from "Full Si" transistor to "Metal Gate/High-k" transistors, the reliability of the $SiO_2$-based gate dielectric is reaching its physical limits. The need for new, high dielectric constant material and processes is increasing and becoming more and more critical as the size for current technology is shrinking. New generations of oxides, especially based on lanthanide-containing materials (having a lanthanide series atom(s) of atomic numbers 57-17, but mainly lanthanum), are thought to give significant advantages in capacitance compared to conventional dielectric materials.

Nevertheless, deposition of lanthanide-containing layers is difficult and new materials and processes are increasingly needed. For instance, atomic layer deposition (ALD) has been identified as an important thin film growth technique for microelectronics manufacturing, relying on sequential and saturating surface reactions of alternatively applied precursors, separated by inert gas purging. The surface-controlled nature of ALD enables the growth of thin films having high conformality and uniformity with an accurate thickness control. The need to develop new ALD processes for lanthanide materials is obvious.

Unfortunately, the successful integration of compounds into deposition processes has proven to be difficult. Three classes of molecules are typically proposed: beta-diketonates, bis(trimethylsilyl)amide and cyclopentadienyls. The two first families of compounds are stable, but the melting points may exceed 90° C., making them impractical. For example, Lanthanum 2,2-6,6-tetramethylheptanedionate's [La(thd)3] melting point is as high as 230° C., and the Lanthanum tris(bis(trimethylsilyl)amido) [La(tmsa)3] melting point is 150° C. Additionally, the delivery efficiency of those precursors is very difficult to control. Non-substituted cyclopentadienyl compounds also exhibit low volatility with a high melting point. Molecule design may both help improve volatility and reduce the melting point. However, in process conditions, these classes of materials have been proven to have limited use. For instance, La(iPrCp)3 does not allow an ALD regime above 225° C.

As discussed above, many of the lanthanide-containing precursors currently available present many drawbacks when used in a deposition process. Consequently, there exists a need for alternate precursors for deposition of lanthanide-containing films.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DETAILED DESCRIPTION OF PREFERRED EMBODIMENTS

The disclosed precursor compounds include a cyclopentadienyl ligand having at least one aliphatic group as a substituent and a bidentate ligand. The precursors have one of these three general formulas:

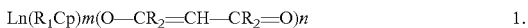
$\text{Ln}(R_1\text{Cp})m(\text{O}-CR_2=CH-CR_2=O)n$     1.

$\text{Ln}(R_1\text{Cp})m(R_3N-CR_2=CH-CR_2=O)n$     2.

$\text{Ln}(R_1\text{Cp})m(R_3N-CR_2=CH-CR_2=NR_3)n$     3.

In the above formulae 1-3, Ln=lanthanide series elements, La, Ce, Pr, Nd, Pm, Sm, Eu, Gd, Tb, Dy, Ho, Er, Tm, Yb, Lu. $R_1$, $R_2$ and $R_3$ are each independently H or $C_1$-$C_5$ alkyl (straight or branched) chains. m=1 or 2 and n=1 or 2.

The disclosed precursor compounds the above formulae 1-3 offer unique physical and chemical properties when compared to their corresponding homoleptic compounds, which include tris-substituted cyclopentadienyl lanthanide compounds, Ln(RCp)3 and tris-substituted beta-diketonate compounds, Ln(O—CR=CH—CR=O)3 (or Ln(R'N—CR=CH—CR=O)3, Ln(R'N—CR=CH—CR=NR')3). Such properties include better control of steric crowding around the metal center, which in turn controls the surface reaction on the substrate and the reaction with a second reactant (such as an oxygen source). Independently fine tuning the substituents on the ligands increases volatility and thermal stability and decreases melting point to yield either liquids or low melting solids (having a melting point below approximately 105° C., preferably below about 80° C.).

Properties of certain exemplary n o ecules and comparison n o ecules are summarized in Table 1.

|  | MW (g/mol) | MP ° C. | Phase at RT |
|---|---|---|---|
| Er(tmsa)3 | 648.81 | 172 | Solid |
| Er(thd)3 | 717.08 | 186 | Solid |
| Er(Cp)3 | 362.55 | 294 | Solid |
| Er(MeCp)3 | 404.62 | 135 | Solid |
| Er(MeCp)2(thd) | 508.77 | 60 | Solid |
| Er(MeCp)2($N^{Et}$O-DK) | 451.67 | Not measured | Liquid |
| Er(MeCp)2($N^{nPr}$O-DK) | 465.70 | Not measured | Liquid |
| La(thd)3 | 688.72 | 230 | Solid |
| La(tmsa)3 | 620.06 | 150 | Solid |
| La(iPrCp)2(thd) | 536.52 | 77 | Solid | thd: —O—C(tBu)=CH—C(tBu)=O
$N^{Et}$O-DK: —(Et)N—C(Me)=CH—C(Me)=O
$N^{nPr}$O-DK: —(nPr)N—C(Me)=CH—C(Me)=O

WORKING EXAMPLES

Example 1—Synthesis of Lanthanum Isopropylcyclopentadienyl tetramethylheptanedionate=La(iPrCp)2(thd)

Figure 1:
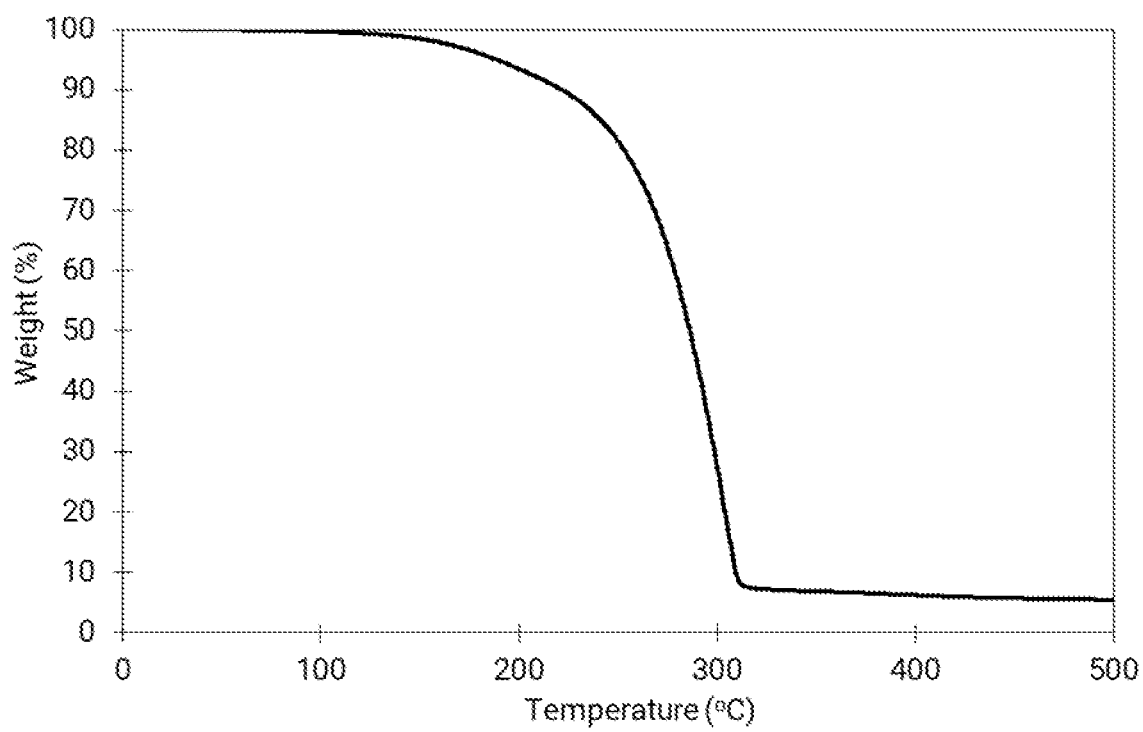
FIG. 1, which is a TGA graph illustrating the percentage of weight upon temperature increase.
Figure 2:
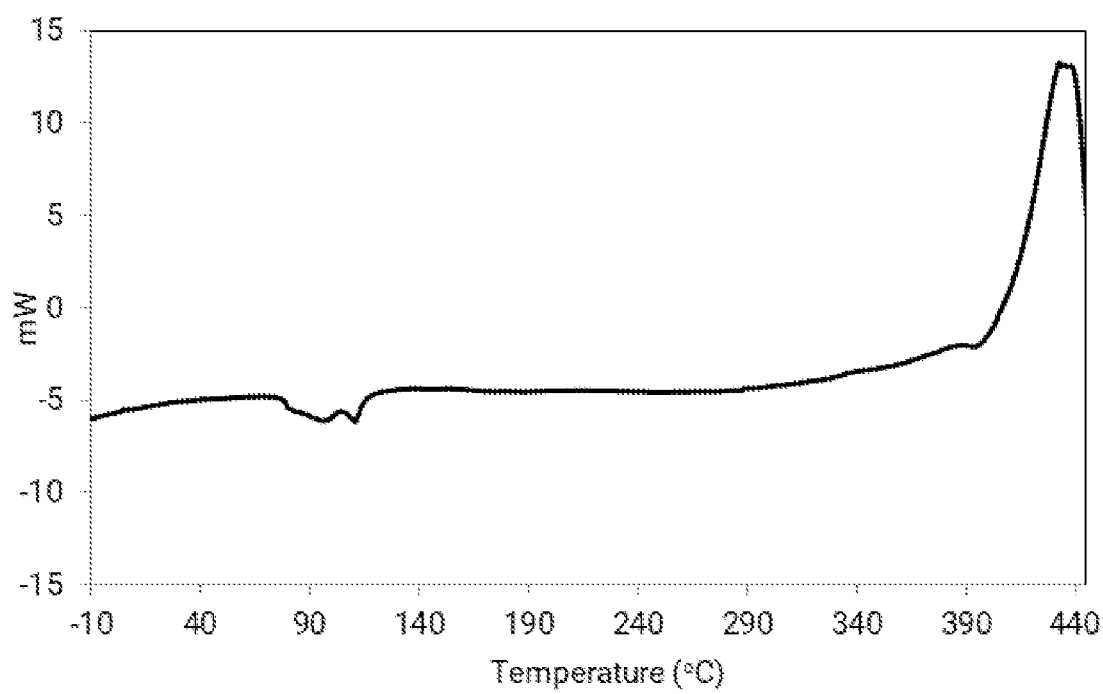
FIG. 2 the onset temperature of melting (77° C.) and decomposition (410° C.) of the product were measured by Differential scanning calorimetry (DSC).

A solution of 2,2,6,6,-tetramethyl-3,5-heptanedione (2 g, 10.8 mmol) in 30 mL of toluene was added dropwise to a solution of La(iPrCp)$_3$ (5 g, 10.8 mmol) in 15 mL of toluene at −78° C. The reaction mixture was warmed slowly to room temperature with stirring overnight. After filtration, the solvent was removed under reduced pressure to obtain a brown solid. The brown solid was sublimed at ~180° C. under 35 mTorr to produce a yellow solid about 44% (2.54 g) yields, The purified product left a 5.4% residual mass during open-cup TGA analysis measured at a temperature rising rate of 10° C./min in an atmosphere which flows nitrogen at 200 mL/min. These results are shown in FIG. 1, which is a TGA graph illustrating the percentage of weight upon temperature increase. Onset temperature of melting (77° C.) and decomposition (410° C.) of the product were measured by Differential scanning calorimetry (DSC), which are shown in FIG. 2.

Notations and Nomenclature

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed. Furthermore, if there is language referring to order, such as first and second, it should be understood in an exemplary sense and not in a limiting sense. For example; it can be recognized by those skilled in the art that certain steps can be combined into a single step.

The singular forms "a", "an" and "The" include plural referents; unless the context clearly dictates otherwise.

"Comprising" in a claim is an open transitional term which means the subsequently identified claim elements are a nonexclusive listing (i.e., anything else may be additionally included and remain within the scope of "comprising"). "Comprising" as used herein may be replaced by the more limited transitional terms "consisting essentially of" and "consisting of" unless otherwise indicated herein.

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A chemical having any one of formulae (a)-(c):

$$\text{La(isopropyl-Cp)}_2\text{(thd)}, \qquad a)$$

$$\text{Er(methyl-Cp)}_2(\text{N}^{Et}\text{O-DK}), \text{ or} \qquad b)$$

$$\text{Er(methyl-Cp)}_2(\text{N}^{nPr}\text{O-DK}), \qquad c)$$

wherein La is Lanthanum, Er is Erbium, Cp is Cyclopentadienyl, N$^{Et}$O-DK is -(Et)N—C(Me)=CH—C(Me)=O, N$^{nPr}$O-DK is -(nPr)N—C(Me)=CH—C(Me)=O, Et is ethyl, Me is methyl, nPr is n-propyl.

2. A composition suitable for use in chemical vapor deposition and/or atomic layer deposition for semiconductor manufacturing, the composition comprising the chemical of claim 1.

3. The composition of claim 2, wherein the chemical is 99% or more of the composition by weight.

4. A method of depositing a lanthanide-containing film, the method comprising a step of providing a vapor phase of the chemical of claim 1 to a chemical vapor deposition or atomic layer deposition process.

5. The method of claim 4, wherein the chemical vapor deposition or atomic layer deposition process produces a lanthanide-containing film on a substrate.

6. The method of claim 5, wherein the substrate is a semiconductor substrate.

\* \* \* \* \*